United States Patent
Kim et al.

(10) Patent No.: US 6,949,480 B2
(45) Date of Patent: Sep. 27, 2005

(54) METHOD FOR DEPOSITING SILICON NITRIDE LAYER OF SEMICONDUCTOR DEVICE

(75) Inventors: Hyung Kyun Kim, Seoul (KR); Sung Hoon Jung, Kyoungki-do (KR); Yong Seok Eun, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/889,477

(22) Filed: Jul. 12, 2004

(65) Prior Publication Data

US 2005/0118814 A1 Jun. 2, 2005

(30) Foreign Application Priority Data

Nov. 28, 2003 (KR) .............................. 10-2003-0085794

(51) Int. Cl.$^7$ .............................................. H01L 21/44
(52) U.S. Cl. ...................... 438/791; 438/253; 438/397; 438/241; 438/243; 438/252; 438/618; 438/626; 438/627; 438/633; 438/639; 438/396; 438/398; 438/637; 438/399; 438/254; 438/239; 438/680
(58) Field of Search .................... 438/253, 397, 438/241, 243, 252, 618, 626, 680, 627, 633, 639, 396, 398, 637, 399, 254, 791, 239

(56) References Cited

U.S. PATENT DOCUMENTS

| | | | | |
|---|---|---|---|---|
| 3,959,443 A | * | 5/1976 | Kabayama | 423/290 |
| 4,948,459 A | * | 8/1990 | van Laarhoven et al. | 438/622 |
| 6,740,580 B1 | * | 5/2004 | Gupta et al. | 438/627 |
| 2001/0055869 A1 | * | 12/2001 | Marsh | 438/597 |

* cited by examiner

Primary Examiner—B. William Baumeister
Assistant Examiner—Victor V. Yevsikov
(74) Attorney, Agent, or Firm—Ladas & Parry LLP

(57) ABSTRACT

Disclosed is a method for depositing a silicon nitride layer of a semiconductor device. The method includes the steps of providing Al-based compound as a catalyst, and reacting DCS with $NH_3$ by using the Al catalyst, thereby depositing the silicon nitride layer. DCS is reacted with $NH_3$ by using the Al catalyst when depositing the silicon nitride layer, so dissolution of DCS is promoted by means of the Al catalyst, so that the silicon nitride layer is deposited at a high speed, thereby improving productivity of semiconductor devices. The silicon nitride layer is deposited by using DCS under a low-temperature condition of about 500 to 800° C., without deteriorating device characteristics.

5 Claims, 2 Drawing Sheets

METHOD FOR DEPOSITING SILICON NITRIDE LAYER OF SEMICONDUCTOR DEVICE

BACKGROUND OF THE INVENTION

1. Field of the Invention

The present invention relates to a method of manufacturing a semiconductor device, and more particularly to a method for depositing a silicon nitride layer by allowing DCS and $NH_3$ to react with each other at a low temperature capable of preventing device characteristics from being deteriorated.

2. Description of the Prior Art

When fabricating semiconductor devices, silicon oxide layers and silicon nitride layers are generally used as insulation layers. The silicon oxide layers and silicon nitride layers are used as buffer layers capable of insulating between electrodes and planarizing a pattern. The silicon nitride layer has a superior etching selectivity against the silicon oxide layer so that the silicon nitride layer is used as a barrier when a contact etching process or a chemical mechanical polishing process is carried out. In addition, the silicon nitride layer has a superior dielectric characteristic, so the silicon nitride layer is used for fabricating a capacitor.

When fabricating the semiconductor device, in a case of a DRAM, the silicon deposition process is achieved through 5 to 10 silicon deposition steps. According to a current tendency, the silicon deposition steps may be further increased.

The silicon nitride layer deposition process is carried out by using (1) $SiH_4$ and $NH_3$, or (2) DCS ($Si_2H_2Cl_2$) and $NH_3$, and source gas used for the deposition process is varied depending on a purpose for depositing the silicon nitride layer.

When $SiH_4$ is used, since $SiH_4$ has superior responsibility, the deposition process is carried out at a high speed and a particle control is easily achieved. However, the silicon nitride layer is not uniformly deposited over the whole area of a wafer, so a weak loading effect is represented.

In contrast, if DCS is used, the silicon nitride layer is evenly deposited over the whole area of the wafer so that superior loading effect is represented. Thus, DCS is widely used in a device having high pattern density. However, since it is required to supply great energy for dissolving DCS, a deposition speed becomes low and powdered particles may be created due to additives, such as $NH_4Cl$. In addition, the deposition process may be performed only under high temperature conditions.

When performing the silicon nitride layer deposition process by using DCS, DCS and $NH_3$, which are source gases, must be dissolved in order to allow DCS to react with $NH_3$ However, in a general semiconductor manufacturing process, a deposition temperature is about 600 to 800° C. DCS cannot be sufficiently dissolved in the above temperature. In addition, it is difficult to increase the deposition temperature because a high temperature may deteriorate device characteristics.

That is, if the deposition temperature is increased above the DCS dissolving temperature, a metal electrode is deformed so that a device characteristic is deteriorated. In addition, a great amount of $NH_4CL$ powder may be created due to a reaction between DCS and $NH_3$. The $NH_4CL$ powder may act as a particle source so that it is impossible to use the above deposition process.

As mentioned above, when manufacturing a semiconductor device, a metal layer is commonly used and a low-temperature thermal process is necessarily required. Thus, even though DCC represents various superior characteristics as mentioned above, there is a limitation if the silicon nitride layer deposition process is carried out by using DCS, because DCS can be deposited only at a high temperature.

SUMMARY OF THE INVENTION

Accordingly, the present invention has been made to solve the above-mentioned problems occurring in the prior art, and an object of the present invention is to provide a method for depositing a silicon nitride layer by using DCS at a low temperature capable of preventing device characteristics from being deteriorated.

In order to accomplish the object, there is provided a method for depositing a silicon nitride layer of a semiconductor device, the method comprising the steps of: providing Al-based compound as a catalyst; and reacting DCS with $NH_3$ by using the Al catalyst, thereby depositing the silicon nitride layer.

According to the preferred embodiment of the present invention, a deposition process for the silicon nitride layer is carried out in a single CVD chamber or a batch type furnace at a temperature of about 500 to 800° C. with pressure above 0.1 Torr.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
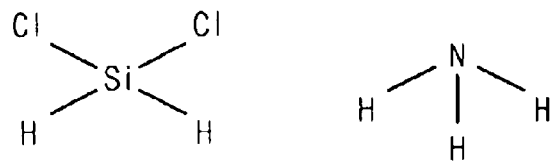
FIGS. 1 to 4 are schematic views for explaining a method for depositing a silicon nitride layer of a semiconductor device.
Figure 1:
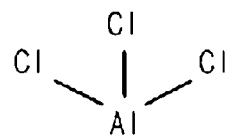

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 1 to 4 are schematic views for explaining a method for depositing a silicon nitride layer of a semiconductor device.

Figure 2:
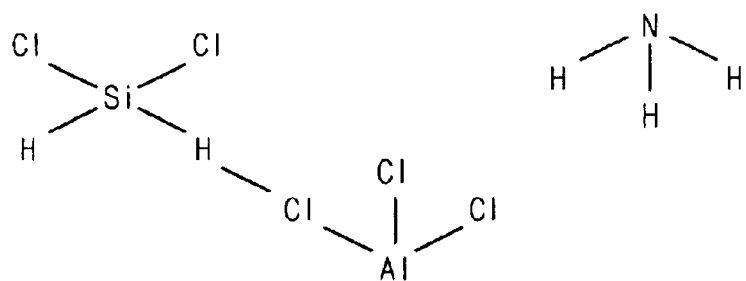

According to a method for depositing a silicon nitride layer of a semiconductor device, as shown in FIG. 1, a small amount of Al-based gas is added to DCS ($SiH_2Cl_2$) and $NH_3$, and then, DCS ($SiH_2Cl_2$) is reacted with $NH_3$. Thus, as shown in FIG. 2, Al acts as a catalyst so that $Al_2Cl_3$ is formed (referred to Equation I).

$$3SiH_2Cl_2+4NH_3+2Al \rightarrow 2AlCl_3+Si_3N_4+9H_2 \qquad \text{Equation I}$$

At this time, such a reaction process is carried out in a single CVD chamber or a batch type furnace having a temperature of about 500 to 800° C. with pressure above 0.1 Torr.

In addition, the Al catalyst is supplied by flowing Al based gas into the CVD chamber or the furnace, or by using Al based gas as a gas source of a gas feeding part of the CVD chamber.

Figure 3:
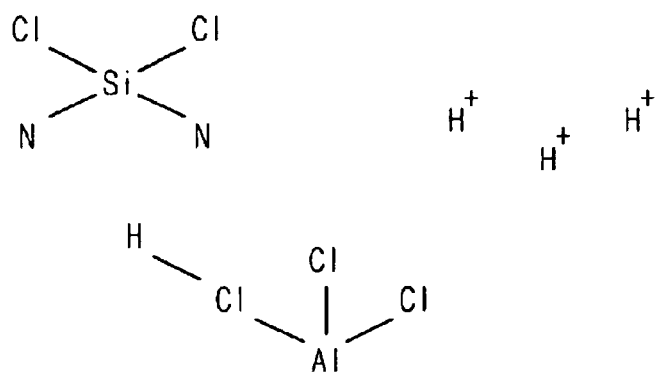

Then, as shown in FIG. 3, $Al_2Cl_3$ is reacted with N dissolved from $NH_3$, thereby forming $SiHCl_2N$. At this time, the Al catalyst may promote dissolution of DCS, so a deposition of the silicon nitride layer is actively carried out. As a result, the silicon nitride layer is deposited at a high speed.

Figure 4:
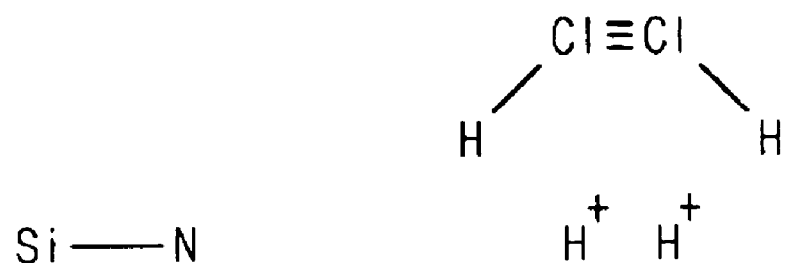
Figure 4:
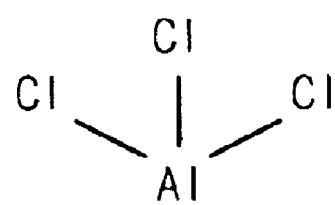

After that, as shown in FIG. 4, $SiHCl_2N$ is dissolved thereby forming an SiN silicon nitride layer.

According to the present invention, DCS is reacted with $NH_3$ by using Al-based compound as a catalyst, thereby depositing a silicon nitride layer. At this time, a catalyst reaction forming $Al_2Cl_3$ is carried out by means of an Al catalyst, and at the same time, DCS dissolution is carried out by means of $Al_2Cl_3$, so that the silicon nitride layer is deposition at a high speed.

As mentioned above, according to the present invention, the silicon nitride layer is deposited by reacting DCS with $NH_3$ by using Al-based compound as a catalyst, so dissolution of DCS is promoted by means of the Al catalyst. Thus, the silicon nitride layer is deposited at a high speed, so productivity of semiconductor devices can be improved.

In addition, according to the present invention, the silicon nitride layer is deposited by using DCS under a low-temperature condition of about 500 to 800° C., which does not deteriorate device characteristics. Accordingly, the silicon nitride layer deposition process can be widely carried out by using DCS having superior loading effect.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for depositing a silicon nitride layer of a semiconductor device, the method comprising the steps of:

i) providing Al-based compound as a catalyst; and ii) reacting DCS with $NH_3$ by using the Al catalyst, thereby depositing the silicon nitride layer.

2. The method as claimed in claim 1, wherein a deposition process for the silicon nitride layer is carried out in a single CVD chamber or a batch type furnace.

3. The method as claimed in claim 1, wherein a deposition process for the silicon nitride layer is carried out at a temperature of about 500 to 800° C.

4. The method as claimed in claim 1, wherein a deposition process for the silicon nitride layer is carried out with pressure above 0.1 Torr.

5. The method as claimed in claim 1, wherein the Al-based compound catalyst is provided by flowing Al-based source gas into a CVD chamber or a batch type furnace.

* * * * *